(12) United States Patent　　　　　(10) Patent No.:　US 12,615,932 B2
　　　Ge　　　　　　　　　　　　　　　(45) Date of Patent:　Apr. 28, 2026

(54) DISPLAY PANEL AND DISPLAY APPARATUS

(71) Applicant: Wuhan Tianma Micro-Electronics Co., Ltd., Wuhan (CN)

(72) Inventor: Shaoxiong Ge, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 611 days.

(21) Appl. No.: 18/111,607

(22) Filed: Feb. 20, 2023

(65) Prior Publication Data

US 2024/0179971 A1　　May 30, 2024

(30) Foreign Application Priority Data

Nov. 29, 2022　(CN) .......................... 202211510718.6

(51) Int. Cl.
　　*H10K 59/131*　　　(2023.01)
　　*H10K 59/65*　　　(2023.01)
(52) U.S. Cl.
　　CPC ........... *H10K 59/131* (2023.02); *H10K 59/65* (2023.02)
(58) Field of Classification Search
　　CPC ....... H10K 59/65; H10K 59/131; G09F 9/335
　　See application file for complete search history.

(56) References Cited

FOREIGN PATENT DOCUMENTS

| | | | | | |
|---|---|---|---|---|---|
| CN | 112599580 A | * | 4/2021 | .......... | H10K 59/126 |
| CN | 113823642 A | * | 12/2021 | .......... | H10D 86/443 |
| CN | 115295604 A | | 11/2022 | | |

* cited by examiner

*Primary Examiner* — Elmito Breval
(74) *Attorney, Agent, or Firm* — Anova Law Group, PLLC

(57)　　　　　　ABSTRACT

A display panel and a display apparatus are provided in the present disclosure. The display panel includes a display region, a first optical device region, a first non-display region and a second non-display region; and further includes at least one first signal line and at least one first connection line. In the display region, a first signal line extends along a first direction and ends at the first optical device region; a first connection line includes a first line segment and a second line segment which are electrically connected to each other; the first line segment is electrically connected to a first signal line on a first side of the first optical device region along the first direction; and the second line segment is electrically connected to a first signal line on a second side of the first optical device region along the first direction.

27 Claims, 11 Drawing Sheets

<u>B-B</u>

C-C

200

100

DISPLAY PANEL AND DISPLAY APPARATUS

CROSS-REFERENCE TO RELATED APPLICATION

The present disclosure claims the priority of Chinese Patent Application No. 202211510718.6, filed on Nov. 29, 2022, the content of which is incorporated herein by reference in its entirety.

TECHNICAL FIELD

The present disclosure generally relates to the field of display technology and, more particularly, relates to a display panel and a display apparatus.

BACKGROUND

With design diversification of display panels, a solution that through holes are formed inside the display region of the display panel to arrange components such as cameras may be currently available. The through holes formed inside the display region may cut off a part of signal lines. Therefore, when the through holes formed in the display region are relatively wide, wirings configured to connect intercepted signal lines may occupy relatively large space in the frame region of the display panel, which may not be beneficial for narrow frame design of the display panel.

SUMMARY

One aspect of the present disclosure provides a display panel. The display panel includes a display region, a first optical device region, a first non-display region and a second non-display region, where the first non-display region surrounds the first optical device region, the display region surrounds the first non-display region, and the second non-display region surrounds the display region; and further includes at least one first signal line and at least one first connection line. A first signal line extends along a first direction in the display region and ends at the first optical device region; a first connection line includes a first line segment and a second line segment which are electrically connected to each other; the first line segment is electrically connected to a first signal line on a first side of the first optical device region along the first direction; the second line segment is electrically connected to a first signal line on a second side of the first optical device region along the first direction; the first line segment is in the first non-display region; and the second line segment is in the display region.

Another aspect of the present disclosure provides a display apparatus including a display panel. The display panel includes a display region, a first optical device region, a first non-display region and a second non-display region, where the first non-display region surrounds the first optical device region, the display region surrounds the first non-display region, and the second non-display region surrounds the display region; and further includes at least one first signal line and at least one first connection line. A first signal line extends along a first direction in the display region and ends at the first optical device region; a first connection line includes a first line segment and a second line segment which are electrically connected to each other; the first line segment is electrically connected to a first signal line on a first side of the first optical device region along the first direction; the second line segment is electrically connected to a first signal line on a second side of the first optical device region along the first direction; the first line segment is in the first non-display region; and the second line segment is in the display region.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
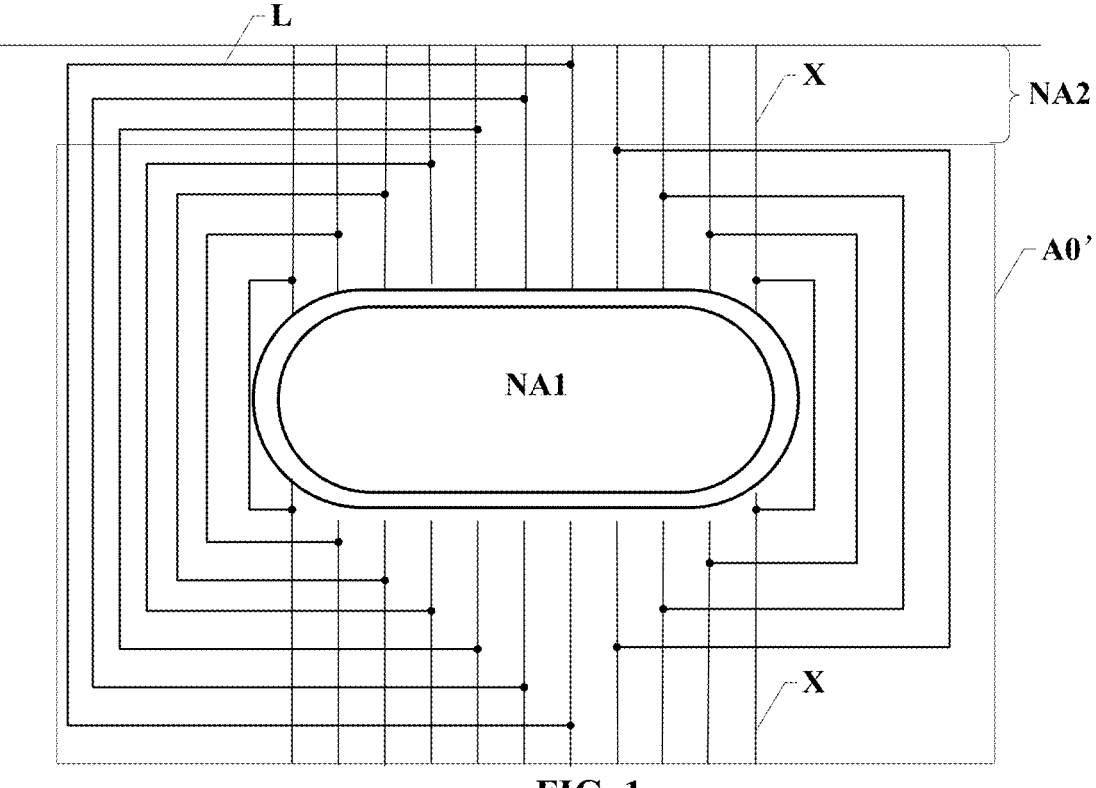
FIG. 1 illustrates a wiring schematic of a region adjacent to an optical device region in a display panel.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters are configured to indicate similar items in following drawings. Therefore, once an item is defined in one drawing, it does not need to be further discussed in subsequent drawings.

FIG. 1 illustrates a wiring schematic of a region adjacent to an optical device region in a display panel. In the existing technology, when an optical device region NA1 with a relatively large width is introduced into the display panel, the quantity of signal lines X intercepted by the optical device region NA1 in the display region A0' may be large; and connection lines L may be introduced to electrically connect intercepted signal lines X with each other. When the distance between the optical device region NA1 and the frame region NA2 of the display panel is relatively close, space may not be sufficient for disposing connection lines in the display region. A relatively large quantity of connection lines L may occupy the space of the frame region NA2 adjacent to the optical device region NA1, which may result in relatively large frame region NA2 of the display panel, thereby being not beneficial for realizing narrow frame design.

The present disclosure provides a display panel. The display panel may include a display region, a first optical device region, a first non-display region and a second non-display region. The first non-display region may surround the first optical device region, the display region may surround the first non-display region, and the second non-display region may surround the display region. The display panel may further include at least one first signal line and at least one first connection line. The first signal line may extend along a first direction in the display region and end at the first optical device region. The first connection line may include a first line segment and a second line segment which are electrically connected to each other. The first line segment may be electrically connected to the first signal line on the first side of the first optical device region along the first direction. The second line segment may be electrically connected to the first signal line on the second side of the first optical device region along the first direction. The first line segment may be in the first non-display region, and the second line segment may be in the display region. In the present disclosure, when electrically connecting the first signal lines with each other on two sides of the optical device region, the space of the first non-display region may be configured to wire the first line segment, and the space of the display region may be configured to wire the second line segment. When such part of the first signal lines is electrically connected to each other, the first connection line may not need to occupy the space of the frame region of the display panel, thereby being beneficial for reducing the quantity of connection lines wired in the frame region of the display region, providing a reducible space (that is, space capable of being reduced) for the frame region and for realizing the narrow frame design of the display panel.

The above is the core concept of the present disclosure, and the technical solutions in embodiments of the present disclosure are clearly and completely described below in conjunction with accompanying drawings in embodiments of the present disclosure. Based on embodiments of the present disclosure, all other embodiments obtained by those skilled in the art without creative work belong to the protection scope of embodiments of the present disclosure.

Figure 2:
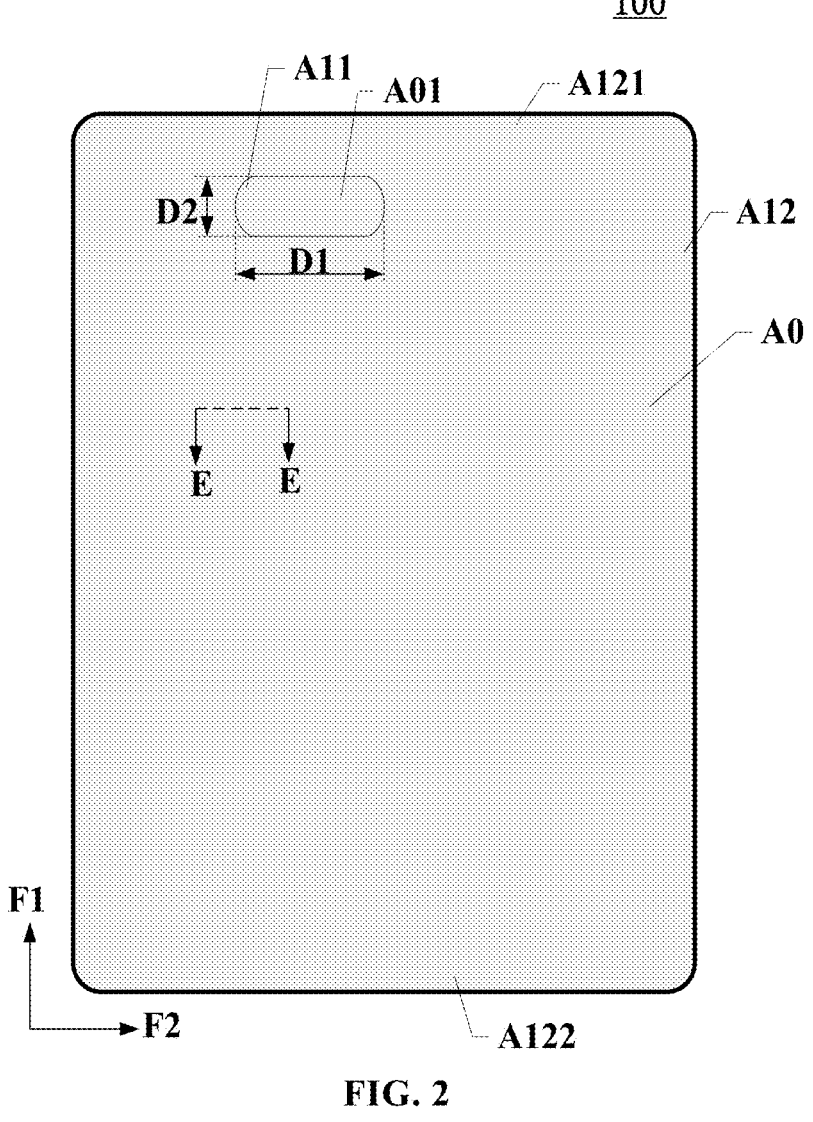
FIG. 2 illustrates a planar schematic of a display panel according to various embodiments of the present disclosure.
Figure 3:
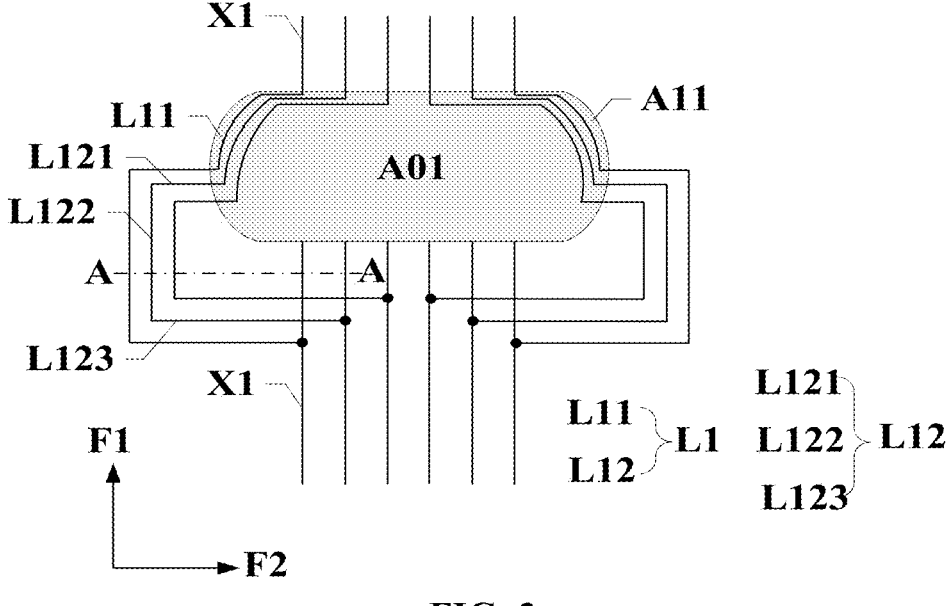
FIG. 3 illustrates a local schematic of a region adjacent to a first optical device region in a display panel according to various embodiments of the present disclosure.

FIG. 2 illustrates a planar schematic of a display panel according to various embodiments of the present disclosure. FIG. 3 illustrates a local schematic of a region adjacent to a first optical device region in a display panel according to various embodiments of the present disclosure. Referring to FIGS. 2-3, various embodiments of the present disclosure provide a display panel 100 which may include a display region A0, a first optical device region A01, a first non-display region A11 and a second non-display region A12. The first non-display region A11 may surround the first optical device region A01, the display region A0 may surround the first non-display region A11, and the second non-display region A12 may surround the display region A0. The display region A0 may be the region of the display panel for mainly emitting light, and the second non-display region A12 may be the region of the display panel where peripheral circuits and packaging are mainly arranged. The location of the first optical device region A01 may be mainly used for configuring optical devices, for example, the first optical device region A01 may be disposed with optical sensors, cameras, face recognition sensors, flashlights and the like. In order to enable the optical devices disposed in the first optical device region A01 to receive light from the outside or emit light to the outside, the transmittance of the first optical device region A01 to such light may be greater than the transmittance of the display region A0 to such light.

It should be noted that when the optical device in the first optical device region A01 emits light to the outside, the optical device in the first optical device region A01 may be different from the sub-pixel in the display region A0, where the first optical device region A01 may not include sub-pixels or include sub-pixels but the first optical device region A01 is in a highly-transparent state.

In addition, in embodiments of the present disclosure, the first optical device region A01 may be arranged in various manners. For example, the first optical device region A01 may include through holes or blind holes. The through hole may pass through the display panel along the thickness direction of the display panel, which may be obtained by cutting the display panel. The blind hole may not pass through the display panel along the thickness direction of the display panel and may be obtained by disposing the sub-pixels to avoid the first optical device region A01.

Referring to FIGS. 2-3, the display panel may further include at least one first signal line X1 and at least one first connection line L1; and the first signal line X1 may extend along the first direction F1 in the display region A0 and end at the first optical device region A01. The first connection line L1 may include the first line segment L11 and thee second line segment L12 which are electrically connected to each other. The first line segment L11 may be electrically connected to the first signal line X1 on the first side of the first optical device region A01 along the first direction F1. The second line segment L12 may be electrically connected to the first signal line X1 on the second side of the first optical device region A01 along the first direction F1. The first line segment L11 may be in the first non-display region A11, and the second line segment L12 may be in the display region A0. Optionally, the first direction F1 is a row direction, and the second direction F2 is a column direction. The first signal line X1 may be a signal line that provides signals for sub-pixels in the display panel, for example, the first signal line X1 may provide data voltage signals for sub-pixels.

The first signal line X1 may extend along the first direction F1 in the display region A0 and end at the first optical device region A01, which may be understood as that if the first optical device region A01 is not configured, entire first signal line X1 may extend along the first direction F1; and after being introduced into the first optical device region A01, the first signal line X1 may be divided into two parts by the first optical device region A01, which are respectively the first signal line X1 on the first side of the first optical device region A01 (which may be considered as the upper side) and the first signal line X1 on the second side of the first optical device region A01 (which may be considered as the lower side) along the first direction F1 Line X1. In order to realize the electrical connection of the first signal lines X1 on the upper and lower sides of the first optical device region A01, the first connection line L1 may be introduced in embodiments of the present disclosure. The first connection line L1 may include the first line segment L11 and the second line segment L12 which are electrically connected to each other. The first line segment L11 may be electrically connected to the first signal line X1 above the first optical device region A01, and the second line segment L12 may be electrically connected to the first signal line X1 below the first optical device region A01. Particularly, the first line segment L11 of the first connection line L1 may be in the first non-display region A11 on the periphery of the first optical device region A01, and the second line segment L12 may be in the display region A0. The first line segment L11 and the second line segment L12 may both not occupy the space of the second non-display region A12 of the display panel, that is, the space of the frame region of the display panel may not be occupied. Therefore, a reducible space may be provided for the frame of the display panel, which may be beneficial for realizing the narrow frame design of the display panel.

Figure 4:
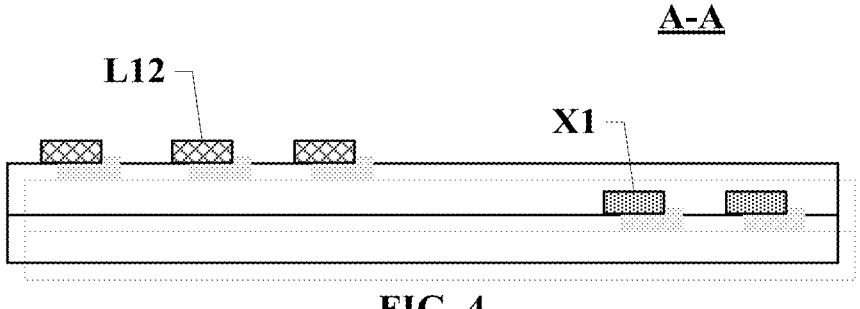
FIG. 4 illustrates a cross-sectional view along an AA direction in FIG. 3.

FIG. 4 illustrates a cross-sectional view along an AA direction in FIG. 3. In an optional embodiment of the present disclosure, the second line segment L12 and the first signal line X1 may be disposed in different layers.

When the second line segment L12 in the display region A0 is disposed in a different layer from the first signal line X1, the layout of the second line segment L12 may not be affected by other signal lines in the film layer where the first signal line X1 may be, that is, there is no need to avoid the signal lines of the film layer where the first signal line X1 may be, which may be beneficial for simplifying the wiring complexity of the display panel. When the second line segment L12 and the first signal line X1 are disposed in different layers, the second line segment L12 and the first signal line X1 may be electrically connected to each other through connection holes.

Optionally, when the second line segment L12 includes a line segment extending along a same direction as the first signal line X1, such part of the second line segment L12 may also be disposed in a same layer as the first signal line X1.

Optionally, the first line segment L11 in the first connection line L1 may be disposed in a same layer as the first signal line X1, and the first connection line L1 may be formed in the first non-display region A11 during the process of forming the first signal line X1. At this point, the first line segment L11 may be electrically connected to the second line segment L12 through a connection hole.

In some other embodiments of the present disclosure, the first line segment L11 in the first connection line L1 may also be disposed in a same layer as at least a part of the second line segment L12, so that forming such part of the second line segment L12 and forming the first line segment L11 may be performed simultaneously. At this point, the first line segment L11 may be electrically connected to the first signal line X1 through a connection hole.

Referring to FIG. 3, in an optional embodiment of the present disclosure, the second line segment L12 may include a first sub-segment L121, a second sub-segment L122 and a third sub-segment L123 which are electrically connected to each other. The first sub-segment L121 and the third sub-segment L123 may extend along the second direction F2, the second sub-segment L122 may extend along the first direction F1, and the first direction F1 may intersect the second direction F2. The first sub-segment L121 and the third sub-segment L123 may be respectively connected to two ends of the second sub-segment L122; the first sub-segment L121 may be electrically connected to the first line segment L11; and the third sub-segment L123 may be electrically connected to the first signal line X1 on the second side of the first optical device region A01 along the first direction F1.

Detailed structure of the second line segment L12 is described in one embodiment. For example, the second line segment L12 may include three sub-segments, which are respectively the first sub-segment L121 and the third sub-segment L123 which are in parallel with each other and extend along the second direction F2, and the second sub-segment L122 which extends along the first direction F1. Two ends of the second sub-segment L122 may be respectively connected to the first sub-segment L121 and the third sub-segment L123, the first sub-segment L121 may be connected to the first line segment L11, and the third sub-segment L123 may be connected to the first signal line X1. The extension direction of the signal line such as the data line and gate line in the display region A0 is the first direction F1 or the second direction F2. Therefore, when the second line segment L12 is introduced into the display region A0, in embodiments of the present disclosure, the second sub-segment L122 in the second line segment L12 may be configured to extend along the first direction F1, and the first sub-segment L121 and the third sub-segment L123 may be configured to extend along the second direction F2, which may be beneficial for simplifying wiring difficulty of the second line segment L12.

It should be noted that in one embodiment, the first signal lines X1 shown in FIG. 3 are only exemplary for illustration, which may not represent the quantity of first signal lines X1 actually included in the display panel. In addition, in one embodiment, FIG. 2 only illustrates the first signal lines X1 ending in the first optical device region A01 and does not illustrate other signal lines X1 ending in the first optical device region A01.

Figure 5:
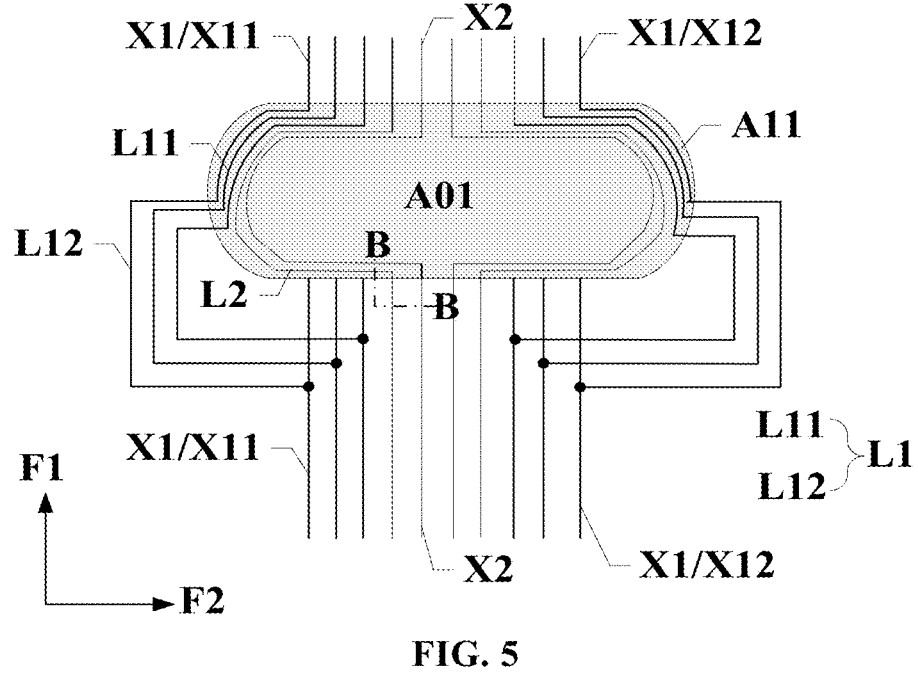
FIG. 5 illustrates another local schematic of a region adjacent to a first optical device region in a display panel according to various embodiments of the present disclosure.

FIG. 5 illustrates another local schematic of a region adjacent to the first optical device region A01 in the display panel according to various embodiments of the present disclosure.

Referring to FIG. 5, in an optional embodiment of the present disclosure, the display panel may further include at least one second signal line X2 and at least one second connection line L2; the second signal line X2 may extend along the first direction F1 in the display region A0 and end at the first optical device region A01; the second connection line L2 may be in the first non-display region A11; and one end of the second connection line L2 may be electrically connected to the second signal line X2 on the first side of the first optical device region A01 along the first direction F1, and the other end of the second connection line L2 may be electrically connected to the second signal line X2 on the second side of the first optical device region A01 along the first direction F1.

The second signal line X2 may be a signal line for providing signals to sub-pixels in the display panel, for example, the second signal line X2 may provide data voltage signals for the sub-pixels. Obviously, in some other embodiments of the present disclosure, the second signal line X2 may also be a signal line that provides bias voltages for sub-pixels in the display panel and the like, which may not be limited in the present disclosure.

In one embodiment, it describes the case that the signal lines ended in the first optical device region A01 may include both the first signal line X1 and the second signal line X2. The wiring manner of the second connection line L2 connected to the second signal lines X2 may be different from the wiring manner of the first connection line L1 connected to the first signal lines X1. For example, entire second connection line L2 is in the first non-display region A11 around the first optical device region A01; one end of the second connection line may be electrically connected to the second signal line X2 above the first optical device region A01, and the other end may be electrically connected to the second signal line X2 below the first optical device region A01. In such way, while the second connection line L2 is introduced to realize the electrical connection of the second signal lines X2, the second connection line L2 may not need to occupy the space of the second non-display region A12, that is, there is no need to occupy the space of the frame region, thereby further providing a reducible space for the frame region of the display panel. When the first connection line L1 is introduced into the display panel to connect the first signal lines X1, and when the second connection line L2 is introduced to connect the second signal lines X2, both the first signal lines X1 and the second signal lines X2 may not occupy the space of the frame region of the display panel, which may be more beneficial for realizing the narrow frame design of the display panel.

In addition, since the second connection line L2 is only wired in the first non-display region A11, the length of the second connection line L2 may be relatively short. After the second signal lines X2 are connected by the second connection line L2, it is beneficial for the length difference of the second signal lines X2 connected by the second connection line L2, and also beneficial for reducing load difference between different second signal lines X2.

Figure 6:
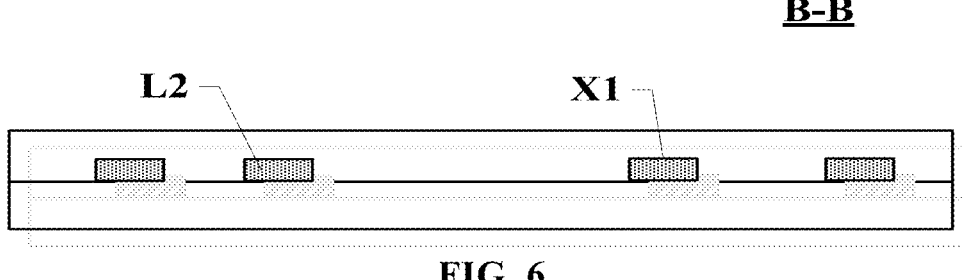
FIG. 6 illustrates a cross-sectional view along a BB direction in FIG. 5.

FIG. 6 illustrates a cross-sectional view along a BB direction in FIG. 5. In one embodiment, a film layer schematic of the second connection line L2 and the second signal line X2 in the display panel is illustrated. In an optional embodiment of the present disclosure, the second connection line L2 and the second signal line X2 may be disposed in a same layer.

For example, when the second connection lines L2 connected to the second signal lines X2 are disposed in the first non-display region A11, in embodiments of the present disclosure, the second connection lines L2 and the second signal lines X2 may be disposed in a same layer. In such way, the fabrication of the second connection line L2 may be completed at the same time as the fabrication of the second signal line X2, that is, the second signal line X2 and the second connection line L2 may be formed in a same fabrication process, thereby being beneficial for simplifying the wiring process of the second signal line X2 and the second connection line L2 and improving the fabrication efficiency of the display panel.

Obviously, in some other embodiments of the present disclosure, the second connection line L2 and the second signal line X2 may also be disposed in different film layers and may be electrically connected to each other through a connection hole, which may not be limited in the present disclosure.

Optionally, the first signal line X1 and the second signal line X2 in embodiments of the present disclosure may be in a same layer and fabricated by a same process.

Referring to FIG. 5, in an optional embodiment of the present disclosure, the first signal lines X1 may be on two sides of the second signal line X2 along the second direction F2, and the second direction F2 may intersect the first direction F1.

For example, when the signal lines ending in the first optical device region A01 include the first signal lines X1 and the second signal lines X2, an optional configuration manner may be to dispose the first signal lines X1 on two opposite sides of the second signal line X2 along the second direction F2. When using the second connection line L2 to connect the second signal lines X2 on the upper and lower sides of the first optical device region A01 along the first direction F1, the second connection line L2 may be completely disposed in the first non-display region A11, such that the second connection line L2 may be wired along the region adjacent to the first optical device region A01 in the first non-display region A11 at this point, a wiring space in the first non-display region A11 may be reserved for the first line segment L11 of the first connection line L1, and the wiring space may be in the region adjacent to the display region A0 in the first non-display region A11. The first line segment L11 in the first connection line L1 may be electrically connected to the second line segment L12 in the display region A0. Therefore, when the first line segment L11 is disposed in the region adjacent to the display region A0 in the first non-display region A11, it is beneficial for simplifying connection difficulty between the first line segment L11 and the second line segment L12.

Referring to FIG. 5, optionally, a part of the second connection line L2 connected to the second signal line X2 may be on one side of the first optical device region A01 along the first direction F1, and another part of the second connection line may be on another side of the first optical device region A01 along the first direction F1. In such way, when the second connection line L2 is disposed in the first non-display region A11, it is beneficial for rationally utilizing the space of the first non-display region A11.

Referring to FIG. 5, in an optional embodiment of the present disclosure, the first signal lines X1 may include the first-side first signal line X11 and the second-side first signal line X12; the first-side first signal line X11 may be on the first side of the second signal line X2 along the second direction F2, and the second-side first signal line X12 may be on the second side of the second signal line X2 along the second direction F2; and the quantity of the first-side first signal lines X11 may be same as the quantity of the second-side first signal lines X12.

For example, when the first signal lines X1 are disposed on two opposite sides of the second signal line X2 along the second direction F2, above-mentioned first-side first signal line X11 may be considered as, for example, the first signal line X1 on the left side of the second signal line X2, and above-mentioned second-side first signal line X12 may be considered as, for example, the first signal line X1 on the right side of the second signal line X2; or above-mentioned first-side first signal line X11 may be considered as the first signal line X1 on the right side of the second signal line X2, and above-mentioned signal line on the second side may be considered as the first signal line X1 on the left side of the second signal line X2. In embodiments of the present disclosure, when the quantity of the first-side first signal lines X11 is configured to be same as the quantity of the second-side first signal lines X12, the first-side first signal lines X11 and the second-side first signal lines X12 may be designed in a symmetrical layout on two sides of the second signal lines X2, thereby being beneficial for simplifying wiring difficulty of the first signal lines X1 and the second signal lines X2.

In one embodiment, the quantity of first-side first signal lines X11 is same as the quantity of first-side first signal lines X12 in FIG. 5, which is taken as an example for illustration. However, in some other embodiments of the present disclosure, the quantities of firs-side first signal lines X11 and the second-side first signal lines X12 may also be configured to be different according to requirements, which may not be limited in the present disclosure.

Referring to FIG. 5, in an optional embodiment of the present disclosure, the first connection line L1 connected to the first-side first signal line X11 may be wired on the first side of the second signal line X2 along the second direction F2. In such way, there is no need to wire such part of the first connection line L1 to the second side of the second signal line X2 along the second direction F2, which may be beneficial for reducing the length of the first connection line L1 connected to the first-side first signal line X11, simplifying wiring difficulty of the first-side first signal lines X11 and the first connection lines L1 and reducing overall load of the first-side first signal lines X11.

Similarly, the first connection line L1 connected to the second-side first signal line X12 may be wired on the second side of the second signal line X2 along the second direction F2. In such way, there is no need to wire such part of the first connection line L1 to the first side of the second signal line X2 along the second direction F2, which may be beneficial for reducing the length of the first connection line L1 connected to the second-side first signal line X12, simplifying wiring difficulty of the second-side first signal lines X12 and the first connection lines L1 and reducing overall load of the second-side first signal lines X12.

When the quantity of the first-side first signal lines X11 is same as the quantity of the second-side first signal lines X12, the quantities of the first connection lines L1 respectively connected to the first-side first signal lines X11 and the second-side first signal lines X12 may also be same. Optionally, the first connection lines L1 respectively connected to the first-side first signal lines X11 and the second-side first signal lines X12 may be wired in a symmetrical manner, thereby further simplifying wiring difficulty of the first connection lines L1.

Referring to FIG. 5, in an optional embodiment of the present disclosure, in the first non-display region A11, the first line segment L11 may be on the side of the second connection line L2 away from the first optical device region A01. In the first connection line L1 configured to connect the first signal lines X1, since the first line segment L11 needs to be connected to the second line segment L12 in the display region A0, the first line segment L11 may be closer to the display region A0 than the second connection line L2 when the first line segment L11 is disposed on the side of the second connection line L2 away from the first optical device region A01. In such way, the connection between the first line segment L11 and the second line segment L12 in the display region A0 may be more convenient, thereby being beneficial for simplifying wiring difficulty of the display panel.

Figure 7:
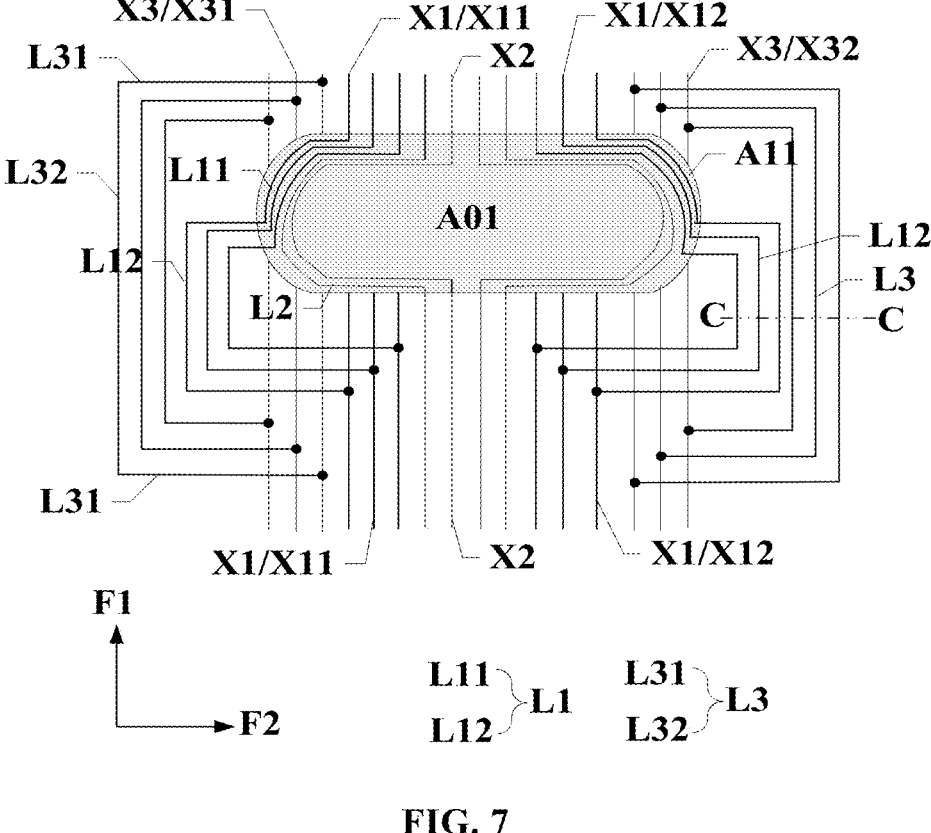
FIG. 7 illustrates another local schematic of a region adjacent to a first optical device region in a display panel according to various embodiments of the present disclosure.

FIG. 7 illustrates another local schematic of a region adjacent to the first optical device region A01 in the display panel according to various embodiments of the present disclosure.

Referring to FIG. 7, in an optional embodiment of the present disclosure, the display panel may further include at least one third signal line X3 and at least one third connection line L3; the third signal line X3 may extend along the first direction F1 in the display region A0 and end at the first optical device region A01; the third connection line L3 may be in the display region A0; and one end of the third connection line L3 may be electrically connected to the third signal line X3 on the first side of the first optical device region A01 along the first direction F1, and the other end of the third connection line L3 may be electrically connected to the third signal line X3 on the second side of the first optical device region A01 along the first direction F1.

The third signal line X3 may be a signal line for providing signals to the sub-pixels in the display panel, for example, the third signal line X3 may provide data voltage signals for the sub-pixels. Obviously, in some other embodiments of the present disclosure, the third signal line X3 may also be a signal line that provides bias voltages for the sub-pixels in the display panel and the like, which may not be limited in the present disclosure.

When the width of the first optical device region A01 along the first direction F1 is relatively large, the quantity of signal lines ending at the position of the first optical device region A01 in the display region A0 may be relatively large. For example, referring to FIG. 8, the signal lines ending at the position of the first optical device region A01 may include not only the first signal line X1 and the second signal line X2, but also the third signal line X3. The third signal lines X3 ending at the position of the first optical device region A01 may be electrically connected through the third connection line L3, where the third connection line L3 may be in the display region A0. In the first connection line L1 connected to the first signal line X1, the first line segment L11 may be in the first non-display region A11, the second line segment L12 may be in the display region A0, the second connection line L2 connected to the second signal line X2 may be in the first non-display region A11, and the third connection line L3 connected to the third signal line X3 may be in the display region A0. Therefore, none of the first connection line L1, the second connection line L2 and the third connection line L3 may occupy the frame space of the display panel, thereby being beneficial for realizing the narrow frame design of the display panel.

Referring to FIG. 7, in an optional embodiment of the present disclosure, along the second direction F2, the third signal line X3 may be on the side of the first signal line X1 away from the second signal line X2.

For example, the third connection line L3 connected to the third signal line X3 may be in the display region A0, wring may not be needed in the first non-display region A11 outside the first optical device region A01. Therefore, compared to the first signal line X1, the third signal line X3 may be disposed at the position farther away from the first non-display region A11, for example, on the side of the first signal line X1 away from the second signal line X2 along the second direction F2. In such way, when the third connection line L3 is configured to connect the third signal lines X3, the wiring of the first connection line L1 and the second connection line L2 may not be affected, which may be convenient for wiring the third connection line L3, thereby being beneficial for simplifying wiring difficulty of the display panel.

Referring to FIG. 7, in an optional embodiment of the present disclosure, along the second direction F2, the third connection line L3 may be on a side of the first connection line L1 away from the first optical device region A01. That is, the third connection line L3 may be wired outside the first connection line L1 and may not occupy the space of the region where the first connection line L1 may be, the wiring of the third connection line L3 and the wiring of the first connection line L1 may not affect each other, thereby also being beneficial for simplifying wiring difficulty of the display panel.

In an optional embodiment of the present disclosure, referring to FIG. 7, the third signal lines X3 may include the first-side third signal line X31 and the second-side third signal line X32, the first-side third signal line X31 may be on the first side of the second signal line X2 along the second direction F2, and the second-side third signal line X32 may be on the second side of the second signal line X2 along the second direction F2; and the quantities of the first-side third signal lines X31 and the second-side third signal lines X32 may be same.

For example, when the quantity of signal lines ending at the position of the first optical device region A01 in the display panel is relatively large, for example, when such part of signal lines includes not only the first signal line X1 and the second signal line X2, but also the third signal line X3, the third signal lines X3 may be evenly disposed on two sides of the second signal line X2 along the second direction F2. For example, the first-side third signal line X31 may be disposed on the side of the first-side first signal line X11 away from the second signal line X2, and the second-side third signal line X32 may be disposed on the side of the second-side first signal line X12 away from the second signal line X2. In embodiments of the present disclosure, when the quantities of the first-side third signal lines X31 and the second-side third signal lines X32 are configured to be same, the first-side third signal lines X31 and the second-side third signal lines X32 may be designed in a symmetrical layout on two sides of the second signal lines X2. Therefore, it is beneficial for simplifying overall wiring difficulty of the first signal lines X1, the second signal lines X2 and the third signal lines X3.

In one embodiment, the quantities of the first-side third signal lines X31 and the second-side third signal lines X32 are same in FIG. 7, which is taken as an example for illustration. However, in some other embodiments of the present disclosure, the quantities of the first-side third signal lines X31 and the second-side third signal lines X32 may also be configured to be different according to requirements, which may not be limited in the present disclosure.

Referring to FIG. 7, in an optional embodiment of the present disclosure, the third connection line L3 connected to the first-side third signal line X31 may be wired on the first side of the second signal line X2 along the second direction F2. In such way, there is no need to wire such part of the third connection line L3 to the second side of the second signal line X2 along the second direction F2, which may be beneficial for reducing the length of the third connection line L3 connected to the first-side third signal line X31, simplifying wiring difficulty of the third signal lines X31 and the third connection lines L3 on the first side, and further reducing overall load of the first-side third signal lines X31 and balancing load difference between different first-side third signal lines X31.

Similarly, the third connection line L3 connected to the second-side third signal line X32 may be wired on the second side of the second signal line X2 along the second direction F2. In such way, there is no need to wire such part of the third connection line L3 to the first side of the second signal line X2 along the second direction F2, which may be beneficial for reducing the length of the third connection line L3 connected to the second-side third signal line X32, simplifying wiring difficulty of the third signal lines X32 and the third connection lines L3 on the second side, and further reducing overall load of the second-side third signal lines X32 and balancing load difference between different second-side third signal lines X32.

Figure 8:
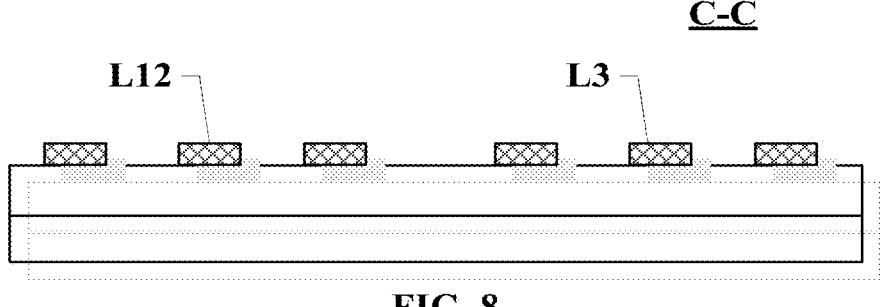
FIG. 8 illustrates a cross-sectional view along a CC direction in FIG. 7.

FIG. 8 illustrates a cross-sectional view along a CC direction in FIG. 7. Referring to FIGS. 2, 7 and 8, in an optional embodiment of the present disclosure, the third connection line L3 and the second line segment L12 may be disposed in a same layer. Both the third connection line L3 and the second line segment L12 in the first connection line L1 are in the display region A0, such that when the third connection line L3 and the second line segment L12 in the first connection line L1 are disposed in a same layer, it is no need to dispose the third connection line L3 and the second line segment L12 in different film layers, and the third connection line L3 and the second line segment L12 may share a same film layer, which may be beneficial for simplifying the film layer structure of the display panel. In addition, when the third connection line L3 and the second line segment L12 are disposed in a same layer, the third connection line L3 and the second line segment L12 may be formed in a same process, which may also be beneficial for simplifying the fabrication process of the display panel.

Figure 9:
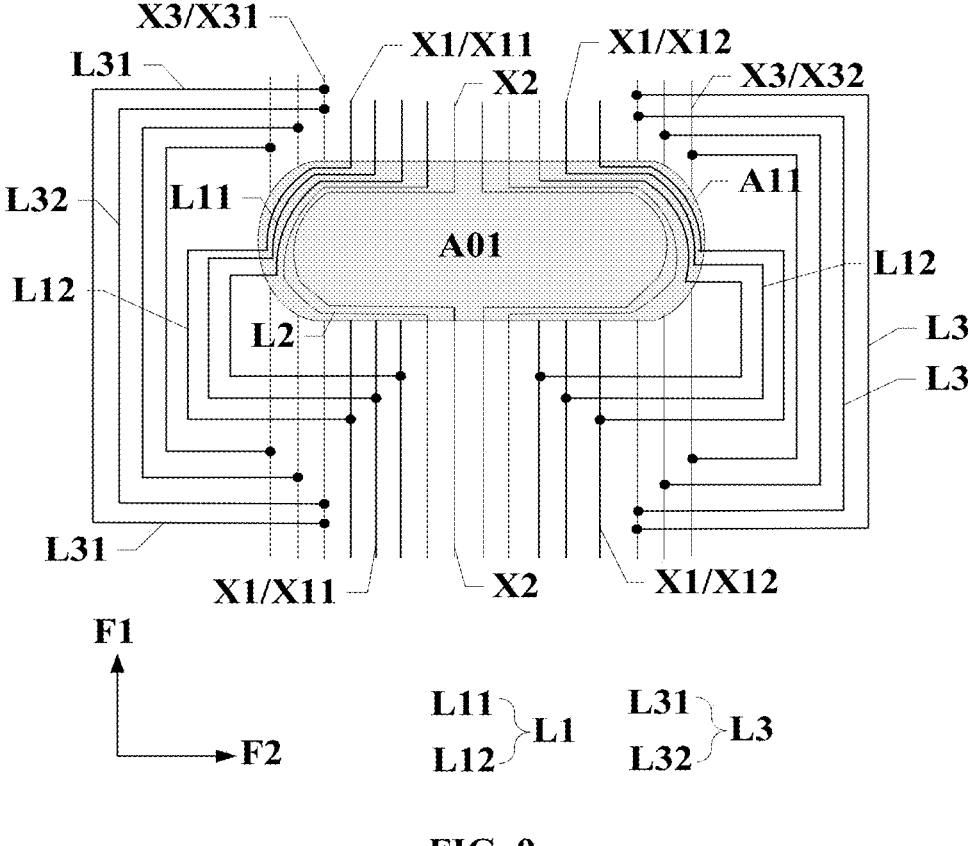
FIG. 9 illustrates another local schematic of a region adjacent to a first optical device region in a display panel according to various embodiments of the present disclosure.

FIG. 9 illustrates another local schematic of a region adjacent to the first optical device region A01 in the display panel according to various embodiments of the present disclosure.

Referring to FIG. 9, in an optional embodiment of the present disclosure, two third signal lines X3 connected to each other may be electrically connected through at least two third connection lines L3 which are connected in parallel. It should be noted that in one embodiment, it only illustrates the manner that the third signal lines X3 at the outermost periphery may be connected through two third connection lines L3 which are connected in parallel, and other third signal lines X3 may also be connected using the third connection lines L3 which are connected in parallel.

For example, when the third connection line L3 is wired at the outer side of the first connection line L1, the length of the third connection line L3 may be relatively large; after the third signal lines X3 are connected through the third connection line L3 with a relatively long length, the load may become relatively large, and the voltage drop of the signal transmitted on the third signal line X3 may be relatively large. In one embodiment, when two third signal lines X3 are electrically connected through at least two third connection lines L3 which are connected in parallel, the impedance of the third connection lines L3 may be reduced through the parallel connection manner, such that overall load of the third signal lines X3 may be reduced. Therefore, it is beneficial for reducing the voltage drop of the signal transmitted on the third signal line X3 to balance the voltage drop difference between the third signal line X3 and each of the first signal line X1 and the second signal line X2.

Referring to FIG. 7, in an optional embodiment of the present disclosure, the third connection line L3 may include two first sub-lines L31 and one second sub-line L32 which is respectively connected to two first sub-lines L31. One of two first sub-lines L31 may be electrically connected to the third signal line X3 on the first side of the first optical device region A01 along the first direction F1, and the other one of two first sub-lines L31 may be electrically connected to the third signal line X3 on the second side of the first optical device region A01 along the second direction F2. The first sub-line L31 may extend along the second direction F2, and the second sub-line L32 may extend along the first direction F1.

Detailed structure of the third signal line X3 is described in one embodiment. For example, the third signal line X3 may include three sub-lines, which are two first sub-lines L31 which are in parallel with each other and extend along the second direction F2, and one second sub-line L32 which extends along the first direction F1. Two ends of the second sub-line L32 may be respectively connected to different first sub-lines L31. One first sub-line L31 may be electrically connected to the third signal line X3 above the first optical device region A01, and the other first sub-line L31 may be electrically connected to the third signal line X3 below the first optical device region A01. The extension direction of the signal line such as the data line and gate line in the display region A0 may be the first direction F1 or the second direction F2. Therefore, when the third signal line X3 is introduced in the display region A0, in embodiments of the present disclosure, the second sub-line L32 in the third signal line X3 may be configured to extend along the first direction F1, and the first sub-line L31 may be configured to extend along the second direction F2, which may be beneficial for simplifying wiring difficulty of the third signal line X3.

Figure 10:
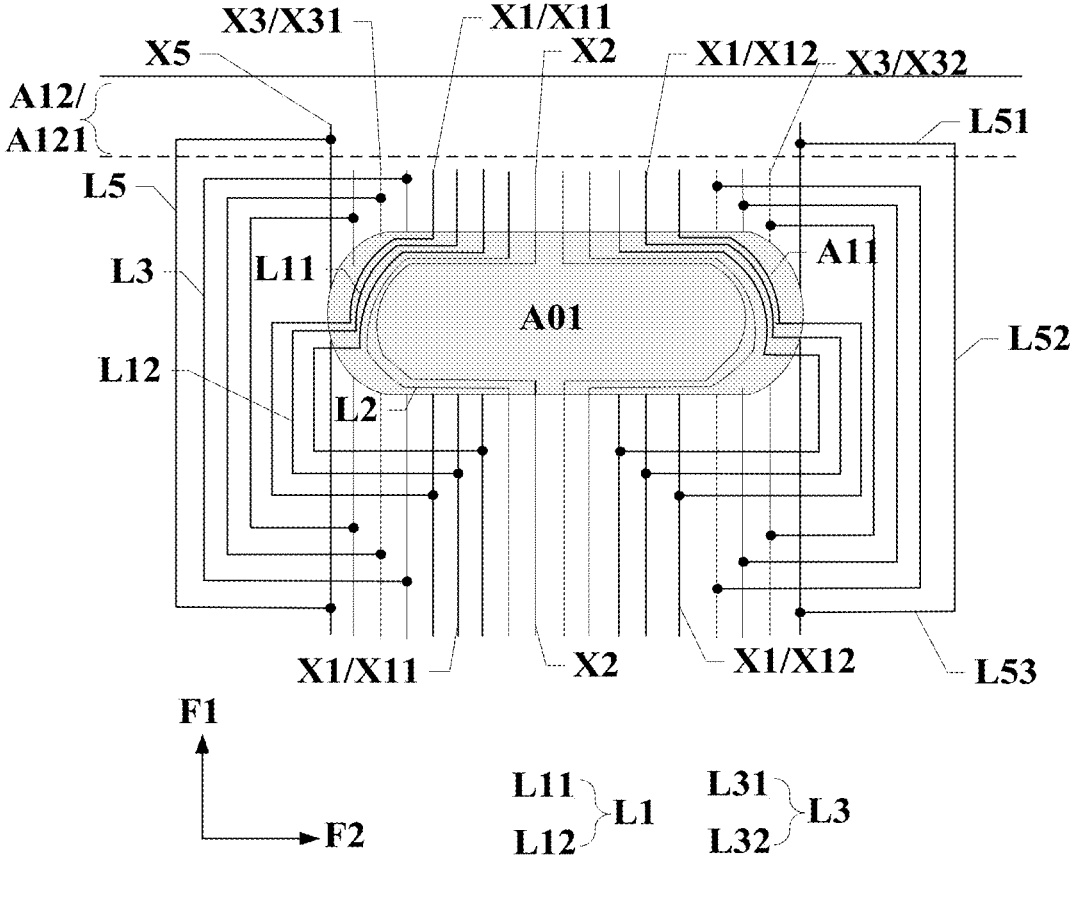
FIG. 10 illustrates another local schematic of a region adjacent to a first optical device region in a display panel according to various embodiments of the present disclosure.

It should be noted that if the width of the first optical device region A01 along the first direction F1 is relatively large, in addition to the first signal line X1, the second signal line X2 and the third signal line X3 in the display region A0, the signal lines may further include a signal line that ends at the position of the first optical device region A01, for example, the fifth signal line X5 in FIG. 10. FIG. 10 illustrates another local schematic of a region adjacent to the first optical device region A01 in the display panel according to various embodiments of the present disclosure. At this point, the fifth signal lines X5 on the upper and lower sides of the first optical device region A01 may be connected through the fifth connection line L5. It is assumed that the fifth connection line L5 includes the first sub-wiring L51, the second sub-wiring L52 and the third sub-wiring L53 which are electrically connected to each other, the first sub-wiring L51 and the third sub-wiring L53 may extend along the second direction F2, the second sub-wiring may extend along the first direction F1. The first sub-wiring L51 may be electrically connected to the fifth signal line X5 above the first optical device region A01, the third sub-wiring L53 may be electrically connected to the fifth signal line X5 below the first optical device region A01. At least a part of the line segments of the third sub-wiring L53 and the second sub-wiring L52 may be in the display region. If the space in the display region is not sufficient to dispose the first sub-wiring L51, the first sub-wiring L51 may be disposed in the first frame region A121. The first connection line L1, the second connection line L2 and the third connection line L3 corresponding to the first signal line X1, the second signal line X2 and the third signal line X3 do not occupy the space of the first frame region A121. That is, among the connection lines corresponding to the intercepted signal lines at the position of the first optical device region A01, only the fifth connection lines L5 corresponding to a small quantity of the fifth signal lines X5 may occupy the space of the first frame region A121. Compared with the manner in the existing technology where a large quantity of connection lines need to occupy the space of the first frame region A121, it is still beneficial for reducing the frame width of the first frame region A121 and realizing narrow the frame requirement of the display panel in the present disclosure.

Figure 11:
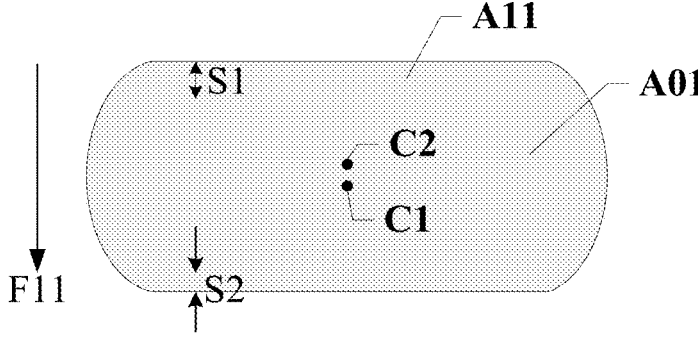
FIG. 11 illustrates a local enlarged schematic of a first optical device region adjacent to a first frame region.

FIG. 11 illustrates a local enlarged schematic of the first optical device region A01 adjacent to the first frame region A121. Referring to FIGS. 2, 5, 7 and 11, in an optional embodiment of the present disclosure, the second non-display region A12 may include the first frame region A121 and the second frame region A122 which are configured on two sides of the display region A0 along the first direction F1. Along the first direction F1, the distance between the first optical device region A01 and the first frame region A121 may be less than the distance between the first optical device region A01 and the second frame region A122. Along the direction F11 from the first frame region A121 to the second frame region A122, the width of the first non-display region A11 may gradually decrease. In the first non-display region A11, the width S1 of the side adjacent to the first frame region A121 may be greater than the width S2 of the side adjacent to the second frame region A122.

For example, referring to FIG. 2, the first frame region A121 in embodiments of the present disclosure may be considered as the upper frame region of the display panel, and the second frame region A122 may be considered as the lower frame region of the display panel. In embodiments of the present disclosure, the first light-emitting device region may be configured at a position adjacent to the upper frame region, which may better satisfy user requirements.

Referring to FIGS. 2, 5, 7 and 11, in an optional embodiment of the present disclosure, the first line segment L11 may be in the first non-display region A11 with a relatively large width. Both the first line segment L11 of the first connection line L1 and the segment L2 of the second connection line are in the first non-display region A11, and the segment of the first connection line L1 is connected to the first signal line X1 above the first optical device region A01; in the first display region A0, the region, where both the first line segment L11 and the second connection line L2 are disposed, is on the side of the first non-display region A11 relatively close to the first frame region A121, and the first line segment L11 does not extend to a side region of the first non-display region A11 away from the first frame region A121. Therefore, the width of the first non-display region A11 adjacent to the first frame region A121 may be configured to be relatively large, so that such part of the region may have sufficient space to dispose the first line segment L11 and the second connection line L2. Only the second connection line L2 needs to be disposed in the region away from the first frame region A121 in the first non-display region A11, the first line segment L11 may not need to be disposed, such that the width of such part of the first non-display region A11 may be configured to be relatively small for reasonable use the space of the first non-display region A11.

Referring to FIG. 2, in an optional embodiment of the present disclosure, the maximum length of the first optical device region A01 along the first direction F1 is D1, and the maximum length of the first optical device region A01 along the second direction F2 is D2, where D1>D2 and the second direction F2 may intersect the first direction F1. In such way, the first optical component region may be a strip shape as a whole. Such design may provide sufficient space the functional components disposed in the first optical device region A01 to improve user experience while considering the screen-to-body ratio and aesthetics of the display panel.

Referring to FIGS. 2 and 11, in an optional embodiment of the present disclosure, along the first direction F1, the geometric center C1 of the first optical device region A01 may be between the geometric center C2 of the first non-display region A11 and the second frame region A122; and the extension direction of the line connecting the geometric center of the first optical device region A01 and the geometric center of the first non-display region A11 may be the first direction F1. That is, the geometric center C2 of the first non-display region A11 may be configured between the first frame region A121 and the geometric center C1 of the first optical device region A01, and the geometric center C2 of the first non-display region A11 may be closer to the first frame region A121 than the geometric center C1 of the first optical device region A01.

In embodiments of the present disclosure, the outer contour of the first optical device region A01 and the outer contour of the first non-display region A11 may be both racetrack-shaped as an example for illustration. The shape of the racetrack may be axisymmetric, which may be considered as a combination of a rectangle and two semicircles. The two semicircles may be on two sides of the short side of the rectangle. For such case, the geometric center refers to the point where two diagonals of the rectangle intersect. In one embodiment, when configuring the geometric center of the first non-display region A11 closer to the first frame region A121 than the first optical device region A01, it is equivalent to moving up the first non-display region A11 as a whole relative to the first optical device region A01. In such way, the width of the part of the first non-display region A11 adjacent to the first frame region A121 may be greater than the width of the part of the first non-display region A11 away from the first frame region A121. The first line segment L11 and the second connection line L2 may be disposed in a region with a relatively large width, thereby fully and rationally utilizing the space of the first non-display region A11.

Figure 12:
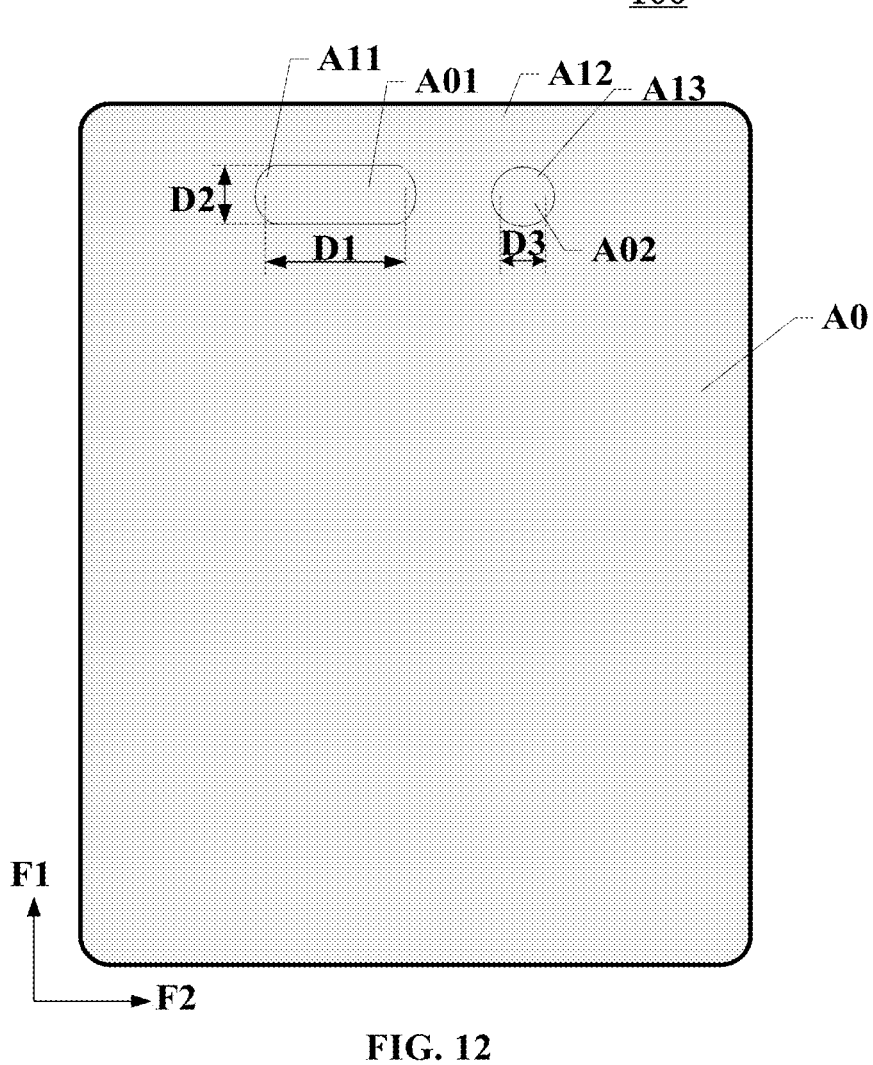
FIG. 12 illustrates another planar schematic of a display panel according to various embodiments of the present disclosure.
Figure 13:
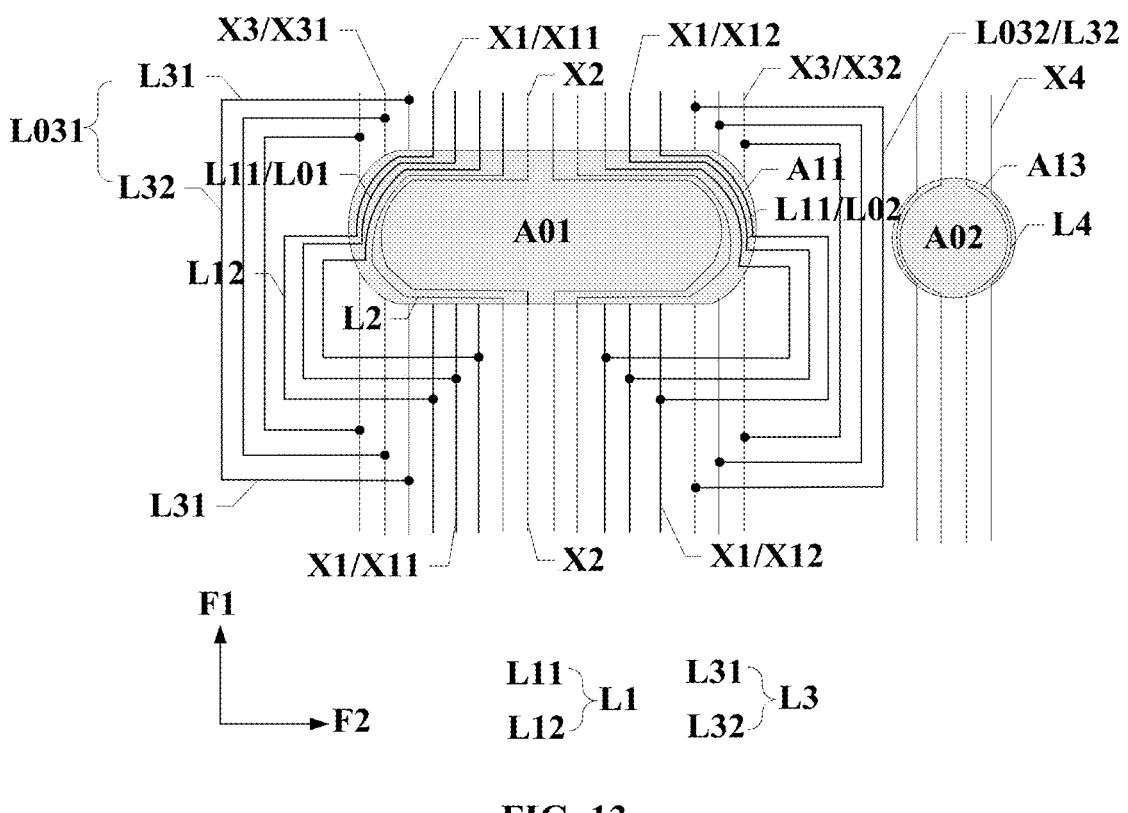
FIG. 13 illustrates another local enlarged schematic of a first optical device region adjacent to a first frame region.

FIG. 12 illustrates another planar schematic of a display panel according to various embodiments of the present disclosure. FIG. 13 illustrates another local enlarged schematic of the first optical device region A01 adjacent to the first frame region A121. In one embodiment, a solution for introducing two optical device regions in the display panel is described.

Referring to FIGS. 12-13, in an optional embodiment of the present disclosure, the display panel may further include the second optical device region A02 and the third non-display region A13; the second optical device region A02 and the first optical device region A01 may be arranged along the second direction F2; the second direction F2 may intersect the first direction F1; the third non-display region A13 may surround the second optical device region A02; the display region A0 may surround the third non-display region A13; and the maximum length of the first optical device region A01 along the first direction F1 is D1, and the maximum length of the second optical device region A02 along the first direction F1 is D3, where D3<D1. Optionally, in a configuration manner, the first optical device region A01 may be configured to dispose an infrared camera correspondingly to realize face recognition function, and the second optical device region A02 may be configured to dispose a photo camera correspondingly to realize picture capturing function. The second optical device region A02 and the first optical device region A01 may be arranged along the second direction F2. Optionally, the second optical device region A02 and the first optical device region A01 may be arranged in a staggered or non-staggered manner along the first direction F1.

The display panel may further include at least one fourth signal line X4 and at least one fourth connection line L4. The fourth signal line X4 may extend along the first direction F1 in the display region A0 and end at the second optical device region A02. The fourth connection line L4 may be in the third non-display region A13; and the end of the fourth connection line L4 may be electrically connected to the fourth signal line X4 on the first side of the second optical device region A02 along the first direction F1, and the other end of the fourth connection line L4 may be electrically connected to the fourth signal line X4 on the second side of the second optical device region A02 along the first direction F1. Optionally, the fourth signal line X4 may be a signal line that provides data signals for the sub-pixels in the display panel, or a signal line that provides bias voltages for the sub-pixels in the display panel and the like, which may not be limited in the present disclosure.

For example, when the fourth signal line X4 ends at the position of the second optical device region A02, the fourth connection line L4 may be configured to realize the electrical connection of the fourth signal lines X4 above and below the second optical device region A02. In embodiments of the present disclosure, the fourth connection line L4 may be disposed in the third non-display region A13 on the periphery of the second optical device region A02. At this point, in addition to reasonable use of the frame of the third non-display region A13, the quantity of connection lines surrounding the third non-display region A13 outside the third non-display region A13 may also be reduced. Therefore, the difference in extension lengths of the fourth connection lines L4 corresponding to different fourth signal lines X4 may be reduced, thereby reducing the load difference between different fourth signal lines X4.

In an optional embodiment of the present disclosure, the fourth connection line L4 and the fourth signal line X4 may be disposed in a same layer. When the fourth connection line L4 and the fourth signal line X4 are disposed in a same film layer, there is no need to increase the quantity of film layers in the display panel, which may be beneficial for simplifying the film layer structure of the display panel. In addition, the fourth connection line L4 and the fourth signal line X4 may also be fabricated in a same fabrication process, which may be beneficial for simplifying overall fabrication process of the display panel.

Figure 14:
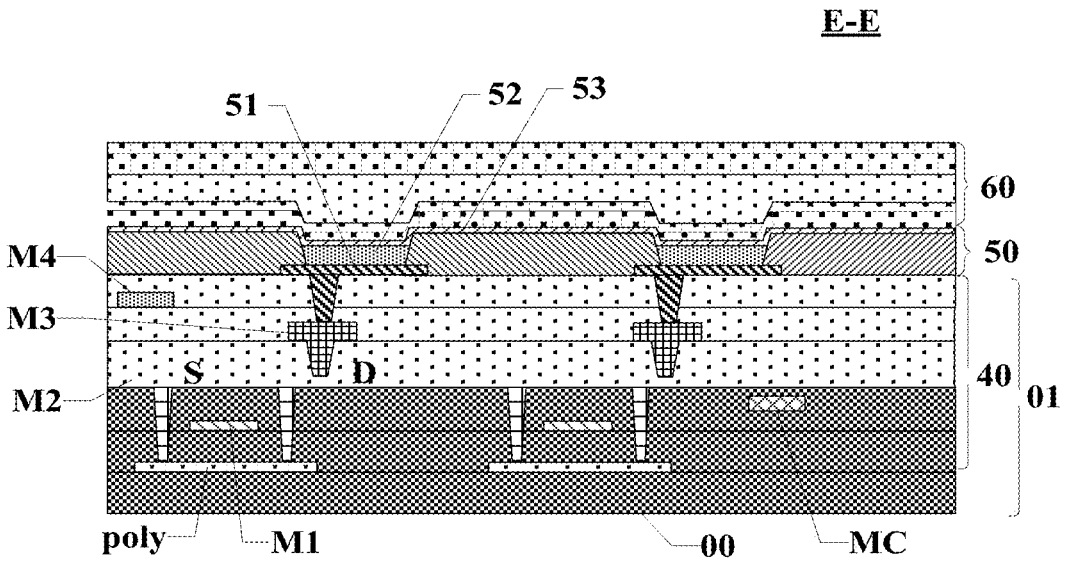
FIG. 14 illustrates a cross-sectional view along an EE direction in FIG. 2.

FIG. 14 illustrates a cross-sectional view along an EE direction in FIG. 2. The display panel may include a substrate 00 and a first metal layer M1, a capacitor metal layer MC, a second metal layer M2, a third metal layer M3, a fourth metal layer M4 and a light-emitting layer 50 disposed on the substrate 00. Along the thickness direction of the display panel, the capacitor metal layer MC may be on the side of the first metal layer M1 away from the substrate 00, and the second metal layer M2 may be on the side of the capacitor metal layer MC away from the substrate 00; and the third metal layer M3 may be on the side of the second metal layer M2 away from the substrate 00, and the fourth metal layer M4 may be between the third metal layer M3 and the light-emitting layer 50. The light-emitting layer 50 may be on the side of the fourth metal layer M4 away from the substrate 00. Optionally, the light-emitting layer 50 may include an anode 51, a light-emitting material layer 52 and a cathode 53. The light-emitting material layer 52 may be between the anode 51 and the cathode; and the anode 51 may be between the light-emitting material layer and the third metal layer M3. The display panel may further include a semiconductor layer poly, and the semiconductor layer poly may be on the side of the first metal layer M1 away from the substrate 00 or on the side of the first metal layer M1 facing toward the substrate 00. The first metal layer M1 may be, for example, a gate metal layer, and the gate electrode of the transistor in the display panel may be disposed in the first metal layer M1; the capacitive metal layer MC may be configured to form a capacitive structure with the first metal layer M1 or the second metal layer M2. The source electrode S and the drain electrode D of the transistor in the display panel may be in the second metal layer M2; the semiconductor layer poly may include a source region and a drain region; and the source region and the drain region may be formed by doping impurity ions including N-type or P-type. impurity ions. The source electrode S of the transistor may be electrically connected to the source region of the semiconductor layer poly through a contact hole, and the drain electrode D of the transistor may be electrically connected to the drain region of the semiconductor layer poly through a contact hole.

Optionally, the first signal line X1, the second signal line X2, the third signal line X3, and the fourth signal line X4 mentioned in embodiments of the present disclosure may be disposed in a same layer; and such signal lines may be in the second metal layer M2 or the third metal layer M3. In embodiments of the present disclosure, the second line segment L12, the second connection line L2 and the third connection line L3 of the first connection line L1 may be in the fourth metal layer M4, which may not be limited in the present disclosure.

Referring to FIG. 13, in an optional embodiment of the present disclosure, the first connection line L1 may include the first-side first connection line L01 and the second-side first connection line L02; the first-side first connection line L01 may be on the first side of the second signal line X2 along the second direction F2; the second-side first connection line L02 may be on the second side of the second signal line X2 along the second direction F2; and the second-side first connection line L02 may be between the first optical device region A01 and the second optical device region A02.

In one embodiment, when the first connection line L02 on the second side is disposed between the first optical device region A01 and the second optical device region A02, the second-side first connection line L02 may not need to be wired on the side of the second optical device region A02 away from the first optical device region A01. While rationally utilizing the space between the first optical device region A01 and the second optical device region A02, it is also beneficial for reducing the length of the first connection line L1, reducing the length difference of the first connection lines L1 corresponding to the second-side first signal lines X12 and further reducing the load difference corresponding to different second-side first signal lines X12.

In an optional embodiment of the present disclosure, the quantity of the first-side first connection lines L01 may be same as the quantity of the second-side first connection lines L02, which may be beneficial for simplifying wiring difficulty of the first connection lines L1. Optionally, the first-side first connection lines L01 and the second-side first connection lines L02 may be arranged symmetrically, thereby being beneficial for reducing the length difference between the first-side first connection lines L01 and the second-side first connection lines L02 and balancing the load difference corresponding to the first-side first signal lines X11 and the second-side first signal lines X12. In some optional other embodiments of the present disclosure, the quantities of the first-side first connection lines L01 and the second-side first connection lines L02 may also be configured to be different according to actual needs, which may not be limited in the present disclosure.

In an optional embodiment of the present disclosure, the third connection line L3 may include the first-side third connection line L031 and the second-side third connection line L032; the first-side third connection line L031 may be on the first side of the second signal line X2 along the second direction F2, and the second-side third connection line L032 may be on the second side of the second signal line X2 along the second direction F2; the third connection line L3 may include the second sub-line L32 extending along the first direction F; and in at least a part of the second-side third connection lines L032, the second sub-line L32 may be between the first optical device region A01 and the second optical device region A02.

For example, when the signal lines ends in the first optical device region A01 include the third signal lines X3, the third signal lines X3 on the upper and lower sides of the first optical device region A01 may be connected through the third connection line L3 in the display region A0; the first-side third connection line L031 refers to the third connection line L3 that is wired from the first optical device region A01 along the first side of the first direction F1; and the second-side third connection line L032 refers to the third connection line L3 that is wired from the first optical device region A01 along the second side of the first direction F1. At least a part of the second-side third connection lines L032 may be wired from the region between the first optical device region A01 and the second optical device region A02. That is, the first sub-lines L31 extending along the second direction F2 among at least a part of the second-side third connection lines L032 may be between the first optical device region A01 and the second optical device region A02. In such way, it is beneficial for rational use of the space between the first optical device region A01 and the second optical device region A02, but also beneficial for reducing the wiring lengths of the third connection lines L3 corresponding to different third signal line X3 and reducing the load of different third signal lines X3.

Figure 15:
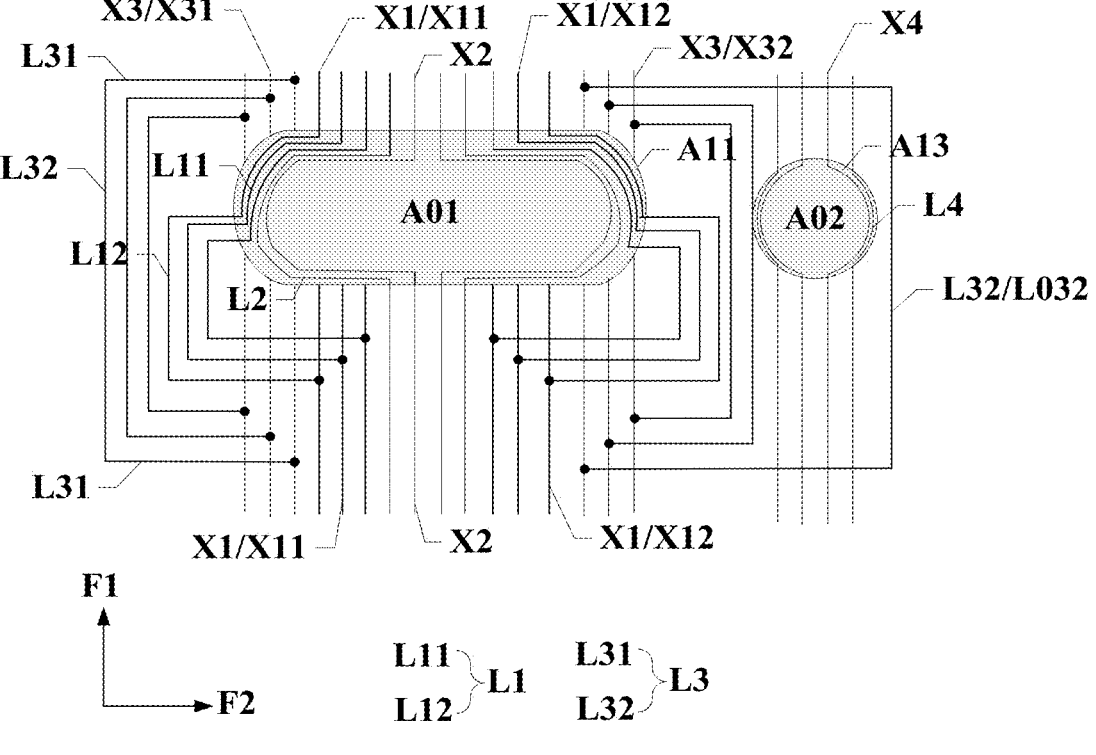
FIG. 15 illustrates another local enlarged schematic of a first optical device region adjacent to a first frame region.

FIG. 15 illustrates another local enlarged schematic of a first optical device region adjacent to a first frame region. Referring to FIG. 15, in an optional embodiment of the present disclosure, the second sub-line L32 may be on the side of the second optical device region A02 away from the first optical device region A01 in at least a part of the second-side third connection lines L032.

For example, if the space between the first optical device region A01 and the second optical device region A02 is limited and not sufficient to dispose all second-side third connection lines L032, a part of the third connection lines L3 may be wired on the side of the second optical device region A02 away from the first optical device region A01, thereby realizing the electrical connection of the third signal lines X3. The length of the third connection line L3 in such part is relatively large; therefore, in order to reduce overall impedance of such part of the third signal lines X3, at least two parallel third connection lines L3 may be configured to connect the third signal lines X3 above and below the first optical device region A01, thereby reducing the load difference between such part of the third signal lines X3 and other third signal lines X3.

Figure 16:
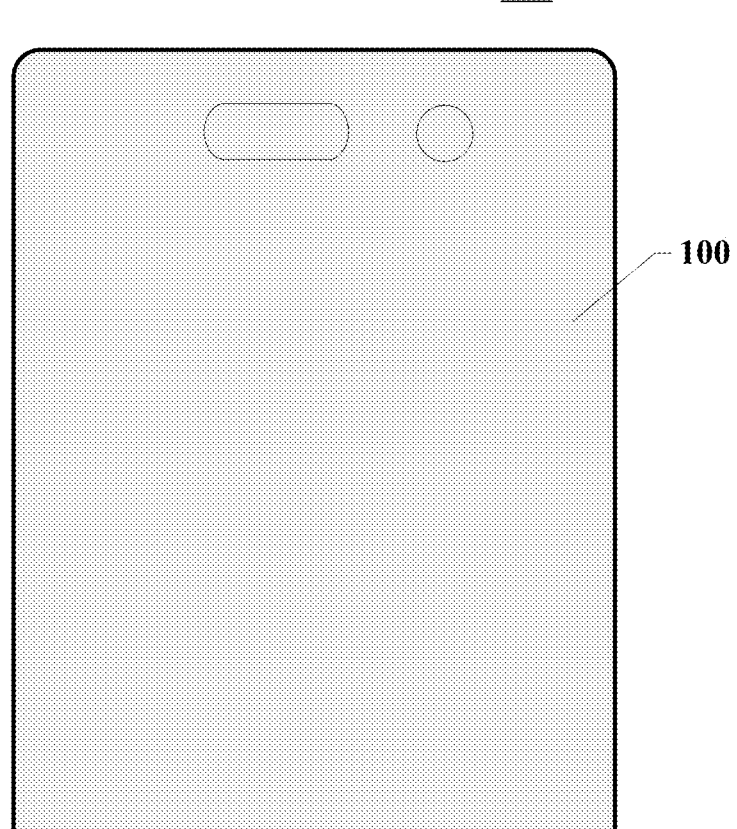
FIG. 16 illustrates a structural schematic of a display apparatus according to various embodiments of the present disclosure.

Based on the same inventive concept, the present disclosure also provides a display apparatus. FIG. 16 illustrates a structural schematic of a display apparatus according to various embodiments of the present disclosure. Referring to FIG. 16, the display apparatus may include the display panel provided by any one of above-mentioned embodiments of the present disclosure.

It may be understood that the display apparatus provided in embodiments of the present disclosure may be a computer, a mobile phone, a tablet, or other display apparatus with a display function, which may not be limited in the present disclosure. The display apparatus provided by embodiments of the present disclosure may have beneficial effect of the display panel provided by embodiments of the present disclosure. Details may refer to the description of the display panel in above-mentioned embodiments, which may not be described in detail in one embodiment.

From above-mentioned embodiments, it may be seen that the display panel and the display apparatus provided by the present disclosure may achieve at least following beneficial effects.

In the display panel and the display apparatus provided by embodiments of the present disclosure, after being introduced into the first optical device region, the first signal lines may be divided into two parts by the first optical device region, which are respectively the first signal line above the first optical device region and the first signal line below the first optical device region along the first direction. In order to realize the electrical connection of the first signal lines on the upper and lower sides of the first optical device region, the first connection line may be introduced in embodiments of the present disclosure. The first connection line may include the first line segment and the second line segment which are electrically connected to each other, where the first line segment may be electrically connected to the first signal line above the first optical device region, and the second line segment may be electrically connected to the first signal line below the first optical device region. Particularly, in the first connection line, the first line segment may be in the first non-display region outside the first optical device region, and the second line segment may be in the display region. Both the first line segment and the second line segment may not occupy the space of the second non-display region of the display panel, that is, the space of the frame region of the display panel may not be occupied. Therefore, a reducible space may be provided for the frame of the display panel, which may be beneficial for realizing the narrow frame design of the product.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A display panel, comprising:
   a display region, a first optical device region, a first non-display region and a second non-display region, wherein the first non-display region surrounds the first optical device region, the display region surrounds the first non-display region, and the second non-display region surrounds the display region; and
   at least one first signal line and at least one first connection line, wherein a first signal line of the at least one first signal line extends along a first direction in the display region and ends at the first optical device region; a first connection line includes a first line segment and a second line segment which are electrically connected to each other; the first line segment is electrically connected to a first signal line on a first side of the first optical device region along the first direction; the second line segment is electrically connected to a first signal line on a second side of the first optical device region along the first direction; the first line segment is in the first non-display region; and the second line segment is in the display region,
   wherein a first portion of the first non-display region where the first line segment is disposed has a larger width than a second portion of the first non-display region where no first line segment is disposed, and the first portion and the second portion are located on two opposite sides of the first optical device region along the first direction.

2. The display panel according to claim 1, wherein:
the second line segment and the first signal line are disposed in different layers.

3. The display panel according to claim 1, wherein:
the second line segment includes a first sub-segment, a second sub-segment and a third sub-segment which are electrically connected to each other, wherein the first sub-segment and the third sub-segment extend along a second direction; the second sub-segment extends along the first direction; and the first direction intersects the second direction; and
the first sub-segment and the third sub-segment are respectively connected to two ends of the second sub-segment; the first sub-segment is electrically connected to the first line segment; and the third sub-segment is electrically connected to the first signal line on the second side of the first optical device region along the first direction.

4. The display panel according to claim 1, further including:
   at least one second signal line and at least one second connection line, wherein:
      a second signal line extends along the first direction in the display region and ends at the first optical device region; and
      a second connection line is in the first non-display region; and one end of the second connection line is electrically connected to a second signal line on the first side of the first optical device region along the first direction, and another end of the second connection line is electrically connected to a second signal line on the second side of the first optical device region along the first direction.

5. The display panel according to claim 4, wherein:
the second connection line and the second signal line are disposed in a same layer.

6. The display panel according to claim 4, wherein:
first signal lines are on two sides of the second signal line along a second direction, and the second direction intersects the first direction.

7. The display panel according to claim 6, wherein:
the first signal lines include first-side first signal lines and second-side first signal lines; the first-side first signal lines are on a first side of the second signal line along the second direction; and the second-side first signal lines are on a second side of the second signal line along the second direction; and a quantity of the first-side first signal lines is same as a quantity of the second-side first signal lines.

8. The display panel according to claim 7, wherein:

first connection lines connected to the first-side first signal lines are wired on the first side of the second signal line along the second direction; and first connection lines connected to the second-side first signal lines are wired on the second side of the second signal line along the second direction.

9. The display panel according to claim 6, further including:

at least one third signal line and at least one third connection line, wherein:

a third signal line extends along the first direction in the display region and ends at the first optical device region; and a third connection line is in the display region; and one end of the third connection line is electrically connected to a third signal line on the first side of the first optical device region along the first direction, and another end of the third connection line is electrically connected to a third signal line on the second side of the first optical device region along the first direction.

10. The display panel according to claim 9, wherein:

along the second direction, the third signal line is on a side of the first signal line away from the second signal line.

11. The display panel according to claim 9, wherein:

along the second direction, the third connection line is on a side of the first connection line away from the first optical device region.

12. The display panel according to claim 9, wherein:

third signal lines include first-side third signal lines and second-side third signal lines; the first-side third signal lines are on a first side of the second signal line along the second direction; and the second-side third signal lines are on a second side of the second signal line along the second direction; and a quantity of the first-side third signal lines is same as a quantity of the second-side third signal lines.

13. The display panel according to claim 12, wherein:

third connection lines connected to the first-side third signal lines are wired on the first side of the second signal line along the second direction; and third connection lines connected to the second-side third signal lines are wired on the second side of the second signal line along the second direction.

14. The display panel according to claim 9, wherein:

the third connection line and the second line segment are disposed in a same layer.

15. The display panel according to claim 9, wherein:

two third signal lines connected to each other are electrically connected through at least two third connection lines connected in parallel.

16. The display panel according to claim 9, wherein:

the third connection line includes two first sub-lines and a second sub-line which is respectively connected to the two first sub-lines; one of the two first sub-lines is electrically connected to the third signal line on the first side of the first optical device region along the first direction, and another one of the two first sub-lines is electrically connected to the third signal line on the second side of the first optical device region along the second direction; and a first sub-line extends along the second direction, and the second sub-line extends along the first direction.

17. The display panel according to claim 9, further including:

a second optical device region and a third non-display region, wherein the second optical device region and the first optical device region are arranged along the second direction, and the second direction intersects the first direction; the third non-display region surrounds the second optical device region, and the display region surrounds the third non-display region; and a maximum length of the first optical device region along the first direction is D1, and a maximum length of the second optical device region along the first direction is D3, wherein D3<D1; and at least one fourth signal line and at least one fourth connection line, wherein a fourth signal line extends along the first direction in the display region and ends at the second optical device region; a fourth connection line is in the third non-display region; and one end of the fourth connection line is electrically connected to a fourth signal line on a first side of the second optical device region along the first direction, and another end of the fourth connection line is electrically connected to a fourth signal line on a second side of the second optical device region along the first direction.

18. The display panel according to claim 17, wherein:

the fourth connection line and the fourth signal line are disposed in a same layer.

19. The display panel according to claim 17, wherein:

first connection lines include first-side first connection lines and second-side first connection lines; the first-side first connection lines are on a first side of the second signal line along the second direction, and the second-side first connection lines are on a second side of the second signal line along the second direction; and the second-side first connection lines are between the first optical device region and the second optical device region.

20. The display panel according to claim 19, wherein:

a quantity of the first-side first connection lines is same as a quantity of the second-side first connection lines.

21. The display panel according to claim 17, wherein:

third connection lines includes first-side third connection lines and second-side third connection lines; and the first-side third connection lines are on a first side of the second signal line along the second direction, and the second-side third connection lines are on a second side of the second signal line along the second direction; and the third connection line includes a second sub-line extending along the first direction; and in at least a part of the second-side third connection lines, second sub-lines are between the first optical device region and the second optical device region.

22. The display panel according to claim 21, wherein:

in at least the part of the second-side third connection lines, the second sub-lines are on a side of the second optical device region away from the first optical device region.

23. The display panel according to claim 4, wherein:

in the first non-display region, the first line segment is on a side of the second connection line away from the first optical device region.

24. The display panel according to claim 1, wherein:

the second non-display region includes a first frame region and a second frame region which are arranged on two sides of the display region along the first direction; along the first direction, a distance between the first optical device region and the first frame region is less than a distance between the first optical device region and the second frame region; and along a direction pointing from the first frame region to the second frame region, a width of the first non-display region gradually decreases.

25. The display panel according to claim 24, wherein:
along the first direction, a geometric center of the first optical device region is between a geometric center of the first non-display region and the second frame region, and an extension direction of a line connecting the geometric center of the first optical device region and the geometric center of the first non-display region is the first direction.

26. The display panel according to claim 1, wherein:
a maximum length of the first optical device region along the first direction is D1, and a maximum length of the first optical device region along a second direction is D2, wherein D1>D2, and the second direction intersects the first direction.

27. A display apparatus, comprising:
a display panel, comprising:
a display region, a first optical device region, a first non-display region and a second non-display region, wherein the first non-display region surrounds the first optical device region, the display region surrounds the first non-display region, and the second non-display region surrounds the display region; and
at least one first signal line and at least one first connection line, wherein a first signal line of the at least one first signal line extends along a first direction in the display region and ends at the first optical device region; a first connection line includes a first line segment and a second line segment which are electrically connected to each other; the first line segment is electrically connected to a first signal line on a first side of the first optical device region along the first direction; the second line segment is electrically connected to a first signal line on a second side of the first optical device region along the first direction; the first line segment is in the first non-display region; and the second line segment is in the display region,
wherein a first portion of the first non-display region where the first line segment is disposed has a larger width than a second portion of the first non-display region where no first line segment is disposed, and the first portion and the second portion are located on two opposite sides of the first optical device region along the first direction.

* * * * *